United States Patent
Pieber et al.

(10) Patent No.: US 8,072,207 B2
(45) Date of Patent: Dec. 6, 2011

(54) DEVICE AND METHOD FOR MEASURING THE FREQUENCY OF A SIGNAL CODED MODULATED CARRIER SIGNAL

(75) Inventors: Michael Pieber, Kumberg (AT); Klemens Breitfuss, Voitsberg (AT)

(73) Assignee: NXP B.V., Eindhoven (NL)

( * ) Notice: Subject to any disclaimer, the term of this patent is extended or adjusted under 35 U.S.C. 154(b) by 452 days.

(21) Appl. No.: 12/376,953

(22) PCT Filed: Aug. 2, 2007

(86) PCT No.: PCT/IB2007/053043
§ 371 (c)(1),
(2), (4) Date: Feb. 9, 2009

(87) PCT Pub. No.: WO2008/017988
PCT Pub. Date: Feb. 14, 2008

(65) Prior Publication Data
US 2010/0164475 A1    Jul. 1, 2010

(30) Foreign Application Priority Data
Aug. 8, 2006   (EP) .................................... 06118622

(51) Int. Cl.
*G01R 31/02* (2006.01)
(52) U.S. Cl. .................................. 324/76.24; 324/76.11
(58) Field of Classification Search ............... 324/76.11, 324/76.24
See application file for complete search history.

(56) References Cited

U.S. PATENT DOCUMENTS

| 6,944,099 B1 | 9/2005 | Preuss et al. |
| 2005/0141638 A1 | 6/2005 | Haiut et al. |
| 2006/0071720 A1 | 4/2006 | Doi |

FOREIGN PATENT DOCUMENTS

| DE | 10127428 A1 | 12/2002 |
| JP | 09203756 | 5/1997 |
| RU | 2210785 C2 | 8/2003 |
| RU | 231077 | 6/2004 |

*Primary Examiner* — Vincent Q Nguyen

(57) ABSTRACT

A device (10) for measuring a frequency of an input signal (IN) that is expected to comprise a carrier signal (CS) either being unmodulated (CSU) or being modulated (CSM) according to a predefined signal coding and relates to a Radio Frequency Identification (RFID) transponder.

15 Claims, 3 Drawing Sheets

DEVICE AND METHOD FOR MEASURING THE FREQUENCY OF A SIGNAL CODED MODULATED CARRIER SIGNAL

FIELD OF THE INVENTION

The invention relates to a device for measuring the frequency of an input signal that is expected to comprise a carrier signal either being unmodulated or being modulated according to a predefined signal coding.

The invention further relates to a method of measuring the frequency of an input signal that is expected to comprise a carrier signal either being unmodulated or being modulated according to a predefined signal coding.

The invention further relates to an RFID transponder.

BACKGROUND OF THE INVENTION

Frequency measuring is usually carried out on uncoded and/or unmodulated signals, because the known measuring methods deliver wrong measuring results when applied to coded signals. For instance, document JP 09203756 discloses a network analyzer having a measuring frequency signal source which generates the desired measuring frequency by using a reference frequency given by a built-in reference frequency signal source. Signals from the frequency signal source are counted by a first counter, while signals from an external reference frequency signal source are counted by a second counter. From the two count values of the counters, a calculation control part judges the accurate frequency of the built-in signal source, thereupon controls the measuring frequency signal source, and emits signals having the desired frequency. The aim of this known device is to enhance the frequency certainty of a measuring signal using a simple circuit at reduced costs.

However, the known device fails in applications where the frequency of a signal has to be determined that is present in a signal coded and modulated form, so that it may have DC signal portions and portions where the carrier signal is oscillating with the carrier signal frequency. Such signals are widely used in the field of RFID systems where a high frequency electromagnetic signal is wirelessly transmitted from an RFID reader to RFID tags being in the transmission range of the RFID reader. The electromagnetic signal is used to carry data and instructions for the RFID tags and to energize the RFID tags when they are configured as what are called passive tags having no power supply on board. The data are usually coded in the electromagnetic signal in a serial signal coded format, for instance according to Manchester coding or Miller coding or modified Miller coding etc. The output of each of said codings is a serial bit stream containing '0' and '1' bits. This bit stream is used to modulate a high frequency carrier signal (e.g. having a carrier signal frequency of 13.56 MHz). Due to the modulation, the resulting signal that is transmitted by the RFID reader contains portions where the carrier signal is oscillating and DC portions (provided that the modulation depth is set to 100%). In order to ensure proper working of the RFID tags, it is necessary to continuously measure the frequency of all input signals in order to discriminate between input signals that meet the specifications and can therefore be properly processed within the RFID tags and incidental signals sent out by external signal sources which must not be processed in the RFID tag in order to prevent malfunctioning. However, due to the signal coding conventional frequency measuring methods fail, since they cannot cope with signals showing high frequency portions and DC portions of varying lengths (but still being within the specification of the RFID system). Another problem is to discriminate between permissible signal coded modulated signals and incidental signals of lower frequencies. In that case the problem is to discriminate between the DC portion of the modulated signal and the regular duty cycle of the low frequency incidental signal.

OBJECT AND SUMMARY OF THE INVENTION

It is an object of the invention to provide a device of the type defined in the opening paragraph and a method of the type defined in the second paragraph, in which the disadvantages defined above are avoided as far as possible.

In order to achieve the object defined above, with a device according to the invention characteristic features are provided so that a device according to the invention can be characterized in the way defined below, that is:

A device for measuring the frequency of an input signal that is expected to comprise a carrier signal either being unmodulated or being modulated according to a predefined signal coding, comprising:

means for generating a measurement period, an input signal counter being adapted to count edges of the input signal during the measurement period, sampling means being adapted to detect whether the input signal contains edges, control means being adapted to read the count value of the input signal counter on expiration of the measurement period and to derive the frequency of the input signal from the count value of the input signal counter, wherein the means for generating a measurement period are adapted to extend the measurement period by a time period during which the absence of edges in the input signal is detected.

In order to achieve the object defined above, an RFID transponder according to the invention comprises a frequency measuring device according to the above paragraph.

In order to achieve the object defined above, with a method according to the invention characteristic features are provided so that a method according to the invention can be characterized in the way defined below, that is:

A method of measuring the frequency of an input signal that is expected to comprise a carrier signal either being unmodulated or being modulated according to a predefined signal coding, the method comprising:

generating a measurement period, counting edges in the input signal during the measurement period, detecting whether the input signal contains edges, on expiration of the measurement period, deriving the frequency of the input signal from the edge count value of the input signal, wherein the measurement period is extended by the time period during which the absence of edges in the input signal is detected.

The characteristic features according to the invention provide the advantage that compared with known multi-step analog methods a digital "one step" determination of the correctness of the frequency of a carrier signal is achievable. Signal coded and modulated carrier signals can be monitored in real time and the signal coding does not result in wrong measurements.

In a preferred embodiment of the invention, the carrier signal is sampled at a constant sample rate and the absence of edges in the carrier signal is detected by detecting whether the level of the carrier signal remains within a predefined range for a predefined number of sampling cycles. This embodiment provides the advantage that the absence of edges in the carrier signal can be detected easily and with a well defined and constant delay, so that this delay can be compensated in the present measuring method.

Extending the measurement period by the time period during which edges are absent from the input signal can be accomplished accurately and with only a few standard electronic components by generating the measurement period by means of a reference clock counter, which is adapted to count edges of a reference clock having a constant reference frequency, wherein the measurement period is defined by the duration the reference clock counter needs to count from a predefined initial value to a predefined final value, wherein counting is temporarily halted when an absence of edges is detected in the carrier signal. The reference clock is preferably provided by a high-accurate reference clock generator which may be built-in in the RFID tag and can also be used to derive other timings and clock signals.

As has been explained above, the absence of edges in the carrier signal is detected with a certain delay. The present invention compensates this delay, thereby avoiding that a wrong result of the frequency measurement is delivered, in that, when after the occurrence of an absence of edges the presence of edges is redetected in the carrier signal, the reference clock counter resumes counting after a delay time that corresponds to the number of sampling cycles that had been necessary to detect said absence of edges in the carrier signal.

When instead of the expected carrier signal an interfering high frequency signal is received at the input frequency measuring device, such an interfering signal could corrupt the results of the frequency measuring process by causing an overflow of the input signal counter resulting in an apparent frequency measuring result that indicates the presence of a signal with a much lower frequency than is actually applied to the input of the frequency measuring device. In order to avoid such a falsified measuring result, the invention proposes to use a counter, which, when the count value of the edges of the carrier signal reaches a predefined maximum value, counting is halted at this maximum count value, or a flag is set indicating that a counting overflow has occurred so that the measuring result is void.

The detection of an absence of edges in the measured input signal may have two reasons: The first one is that the carrier signal has been modulated accordingly, the second one is that instead of the expected carrier signal an interfering low frequency signal is received at the input of the frequency measuring device having a duty cycle wherein the signal remains at a signal level for a duration that exceeds the measurement period. In the latter case the frequency measuring device would misinterpret the signal. In order to avoid such a misinterpretation, the invention suggests that even in case of detected absence of edges in the input signal the measurement period is not extended unless prior to said detected absence of edges in the input signal a preset number of edges has been counted in the signal.

It may happen that the signal received at the input of the input signal counter does not contain edges for an unexpected long time period. This may occur for instance when the RFID transponder having incorporated the frequency measuring device has left the transmission range of an RFID reader. In that case the measurement period would be extended by an unpredictable amount of time. As a precaution against such a dead-lock of the frequency measuring device, it is suggested that the generation of another measurement period is started if no edge in the carrier signal has been detected for a predefined monitoring period. Preferably, this is accomplished by a watchdog timer that is reset each time an edge is detected in the carrier signal.

In many applications of the invention it is not necessary to measure an absolute value of the frequency of an input signal. Rather, it is sufficient to detect that the frequency of the measured signal is within a given frequency range. In such a case the number of edges of the carrier signal that have been counted during the measurement period are simply evaluated whether they lie within a given count range that is representative of the admissible frequency range.

BRIEF DESCRIPTION OF THE DRAWINGS

The invention will be described in more detail hereinafter with reference to an exemplary embodiment. However, the invention is not limited to this exemplary embodiment.

DESCRIPTION OF EMBODIMENTS

Figure 1:
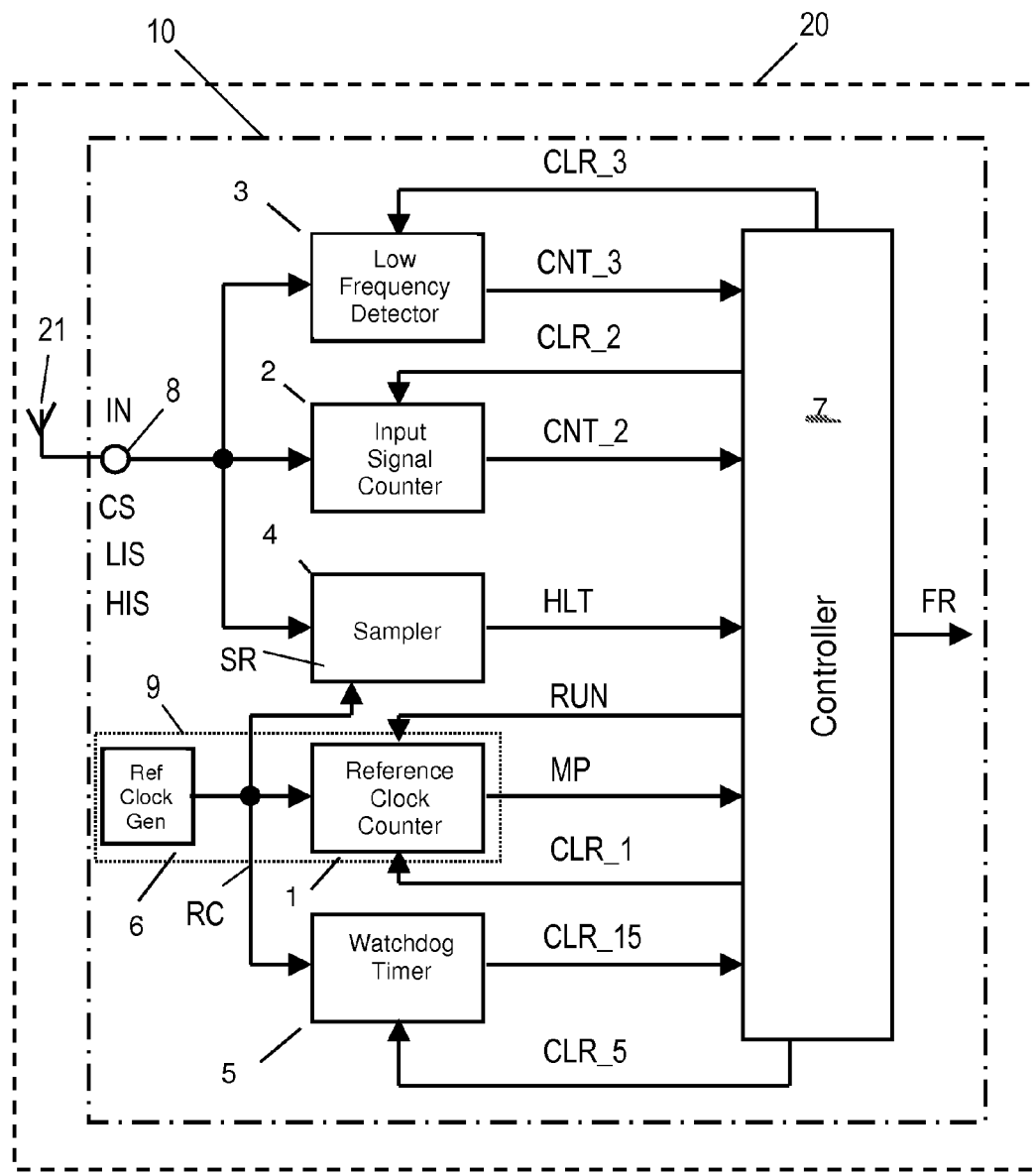
FIG. 1 shows a schematic block circuit diagram of a frequency measuring device according to the invention that is integrated in an RFID transponder.

FIG. 1 shows a schematic block circuit diagram of a frequency measuring device 10 for measuring the frequency of an input signal IN. The frequency measuring device 10 is integrated in an RFID transponder 20 which, except for the frequency measuring device 10, can be configured as a conventional RFID transponder and therefore needs no specific explanations. Persons skilled in the art are well acquainted with the function and design of conventional RFID transponders. The input signal IN is received at an antenna 21 of the RFID transponder 20 and is forwarded to an input port 8 of the frequency measuring device 10. It is expected that the input signal IN comprises a carrier signal CS (see timing diagram of FIG. 2) that contains unmodulated carrier signal portions CSU and modulated carrier signal portions CSM according to a predefined signal coding. Such signals are used in RFID systems and are wirelessly transmitted from an RFID reader to RFID transponders which are situated in the transmission range of the RFID reader. The modulated carrier signal CS contains data and/or instructions for the RFID transponders. The modulated carrier signal CS also functions to energize the RFID transponders when they are configured as what are called passive tags having no power supply on board. The data and instructions are coded in the electromagnetic signal in a serial signal coded format, for instance according to Manchester coding or Miller coding or modified Miller coding etc. The output of each of said codings is a serial bit stream containing '0' and '1' bits. It should be observed that these codings are merely examples for codes that can be used, but various other codes can be employed, too, depending on the respective application of the RFID system. The bit stream coded in a base band is used to modulate a high frequency carrier signal (e.g. having a carrier signal frequency of 13.56 MHz). If the modulation depth is set to 100%, resulting modulated carrier signal CS contains said unmodulated signal portions CSU where the carrier signal is oscillating and said modulated signal portions CSM where the signal appears as a DC signal.

However, the assumption that the input signal IN is a modulated or non-modulated carrier signal CS is not necessarily true, but of course the antenna 21 also receives interfering signals from external sources if they are present in the receiving range of the antenna 21. Such interfering signals may comprise high frequency interfering signals HIS or low frequency interfering signal LIS. In order to ensure proper working of the RFID transponder 10 it is necessary to continuously measure the frequency of all input signals IN, thereby enabling the RFID transponder 10 to discriminate between input signals IN that meet the specifications, i.e. are the expected modulated carrier signals CS and hence are to be processed in the RFID transponder 10 and said interfering signals LIS, HIS that have to be discarded in order to prevent malfunctioning of the RFID transponder 10.

The frequency measuring device 10 according to the invention is preferably designed in low power consuming technology, so that it is applicable to RFID transponders. It comprises means 9 for generating a measurement period MP during which the measuring of the frequency of the input signal IN is carried out. In the depicted preferred embodiment of the invention, the means 9 for generating a measurement period comprise a reference clock counter 1. This reference clock counter 1 is adapted to count edges of a reference clock signal RC that has a constant reference frequency, e.g. 36 MHz, wherein the reference clock signal RC is either fed from a reference clock generator 6 forming part of the means 9 for generating a measurement period, as illustrated in the present example, or is taken from a reference clock generator being present elsewhere in the RFID transponder 20. Basically, the measurement period MP is defined by the duration the reference clock counter 1 needs to count from a predefined initial value to a predefined final value, i.e. a predefined number of reference clock cycles. In the present embodiment the reference clock counter 1 comprises internal logic means that are responsible for starting the reference clock counter 1 to count from the initial value and to continuously compare whether the momentary count value has reached the final value. When counting of the reference clock counter 1 is started, the internal logic means set a binary output signal MPS to logic '1' (see FIG. 2). When the reference clock counter 1 has reached the final value, counting is stopped and the output signal MPS is set to logic '0'. Hence, the output signal MPS of the reference clock counter 1 indicates the measurement period MP. It should be observed that in another embodiment of the invention the reference clock counter does not comprise said internal logic means, but simply delivers its momentary count value to the control means 7 that, beside various other functions, carry out the function described above of the internal logic means and fully control the reference clock counter.

The frequency measuring device 10 further comprises an input signal counter 2, which is adapted to receive the input signal IN from the input port 8 of the frequency measuring device 10 and to count the number of edges of the input signal IN that occur during the measurement period MP as indicated by the output signal MPS of the reference clock counter 1. The momentary count value CNT_2 is transmitted to the control means 7 that derive from the count value CNT_2 a frequency FR of the input signal IN. For applications, where it suffices to have a yes/no decision whether the frequency is within an admissible range or not, said yes/no decision is derived by evaluating whether the count value CNT_2 of the input signal counter 2 lies between predefined upper and lower limit values. For each new frequency measurement the input signal counter 2 is reset to zero by the control means 7 via signal CLR_2. In other words, according to the invention, frequency measurement of the input signal IN is based on the comparison of count values of the reference clock counter 1 and of the input signal counter 2. This approach however, requires that edges appear at a constant frequency in both the reference clock signal RC and the input signal IN signal. While this requirement is certainly met for the reference clock signal RC, which is derived from a highly stable reference clock generator 6, it is definitely not met for the input signal IN if this is the expected modulated carrier signal CS comprising modulated carrier signal portions CSM, also called "signal breaks". Hence, frequency measurement by comparing the count values of the reference clock counter 1 and the input signal counter 2 must fail for the modulated carrier signal CS. However, the invention provides a solution to this problem.

Figure 2:
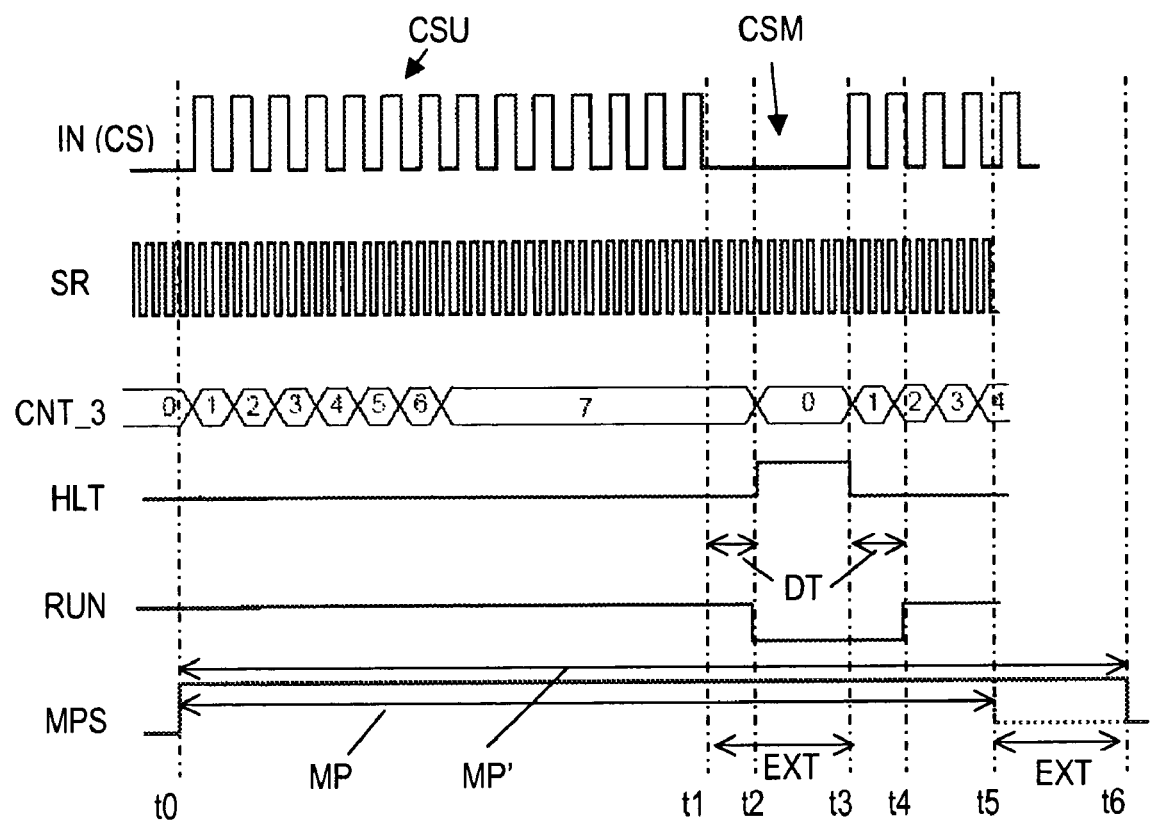
FIG. 2 shows a timing diagram of the frequency measuring device according to the invention.

The basic idea of the invention is to temporarily halt counting of the reference clock counter 1 as long as no edges are present in the input signal IN, assuming that the absence of edges in the input signal IN is due to signal breaks in the modulated carrier signal CS and to resume counting when the input signal IN again contains edges. This basic idea is implemented by means of sampling means 4 which are adapted to sample the input signal IN at a predetermined sample rate SR. It is appropriate to use the reference clock signal to trigger the sampling cycles so that the sample rate SR corresponds to the frequency of the reference clock signal RC. However, this is not a mandatory condition, but the sample rate may be derived from other clock signals. Since the duty cycles of the modulated carrier signal CS are known, the rule may be defined that edges are absent from the input signal IN if the sampling means detect that the level of the input signal has remained within a predefined range of levels for a predefined number of sampling cycles. When the sampling means 4 detect the absence of edges in the input signal IN, they issue a signal HLT to the control means 7, indicating this detected absence of edges. As can be seen in FIG. 2, signal HLT is a binary signal being kept at '0' when edges are detected within an expected frequency and being kept at '1' when and as long as the absence of edges is detected. The control means 7 process the signal HLT by interrupting the counting of the reference clock counter 1 via signal RUN as soon as the signal HLT has been switched to '1' and resuming the counting of the reference clock counter 1 when the signal HLT has again been switched to '0' plus a predefined delay time DT.

For a better understanding of the invention the behavior of the frequency measuring device 10 is now explained by way of the timing diagram shown in FIG. 2. The uppermost time curve in this diagram shows the input signal IN being the modulated carrier signal CS that contains unmodulated carrier signal portions CSU and modulated carrier signal portions CSM. Let us say that a new measurement period MP is started at time t0 as illustrated by the output signal MPS of the reference clock counter 1 in the bottom curve of the diagram and should have a duration until time t5. In order to initiate the generation of a new measurement period MP, the control means 7 have set the reference clock counter 1 to its initial value by means of curve CLR_1 and have set the curve RUN to '1'. At a time t1 the input signal IN changes from the unmodulated carrier signal portion CSU to the modulated carrier signal portion CSM. The sampling means 4 sample the input at a constant sample rate SR (second time curve from above) and need a couple of sampling cycles until they detect the absence of edges in the input signal IN at time t2. The duration between times t2 and t1 is the delay time DT. At time t2 the sampling means 4 switch the signal HLT from '0' to '1'. As a consequence, the control means 7 immediately switch the signal RUN from '1' to '0', thereby instructing the reference clock counter 1 to interrupt counting of the edges in the reference clock signal RC, the frequency of which corresponds to the sample rate SR. When the sampling means 4 detect the re-occurrence of edges in the input signal IN at a time t3, they switch the signal HLT from '1' to '0'. In response to the signal HLT, the control means 7 let the delay time DT pass and then switch the signal RUN from '0' to '1', thereby compensating for the delay that had occurred earlier until the sampling means 4 had detected the absence of edges in the input signal IN. The reference clock counter 1 resumes counting until the final counting value has been reached and then switches the signal MPS from '1' to '0' at time t6. It will be appreciated that the originally planned measurement period MP (difference between t5 and t0) has been extended by the amount of time EXT to the extended measurement period MP' ending at t6, which extended amount of time EXT is exactly the duration of the modulated carrier signal portion CSM. Without extending the measurement period MP to the extended measurement period MP', the frequency measurement would have been falsified due to the occurrence of the signal break in the input signal IN.

Figure 3:
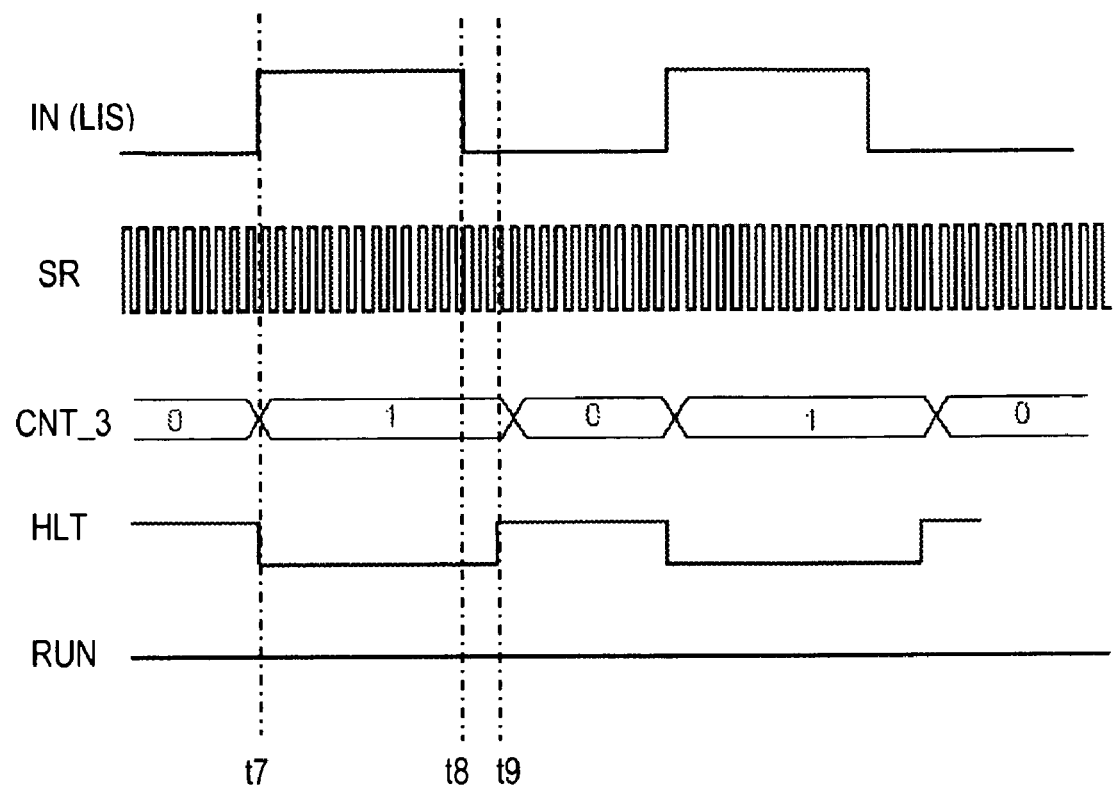
FIG. 3 shows another timing diagram of the frequency measuring device according to the invention.

Taking into account that the input signal IN could be a low frequency interfering signal LIS instead of a carrier signal CS, some precautionary measures must be taken to enable the frequency measuring device 10 to discriminate the low frequency interfering signal LIS from the signal break of a modulated carrier signal CS. This measure comprises providing a low frequency detector 3 which is adapted as a counter that counts the number of edges occurring in the input signal IN. Configuring said counter as a 3-bit counter (count values CNT_3 between 0 and 7) will for most cases be appropriate. If the count value CNT_3 is below a predefined threshold values (e.g. 7 counted edges) the control means 7 will not interrupt counting of the reference clock counter 1 (i.e. signal RUN will remain on '1') even when the sampling means 4 have already detected the absence of edges in the input signal IN. This timing is illustrated in the timing diagram in FIG. 3. In this timing diagram the uppermost time curve represents a low frequency interfering signal LIS as input signal IN, the second curve represents the sample rate SR, the third curve represents the count value CNT_3 of the low frequency detector 3, the fourth curve represents the signal HLT controlled by the sampling means 4 and the bottom curve represents the signal RUN which is controlled by the control means 7. The low frequency interfering signal LIS has a duty cycle of 50% with a period length of twice the length EXT of the modulated portion CSM of the modulated carrier signal CS (see uppermost curve in FIG. 2). At a time t7 a rising edge occurs in the input signal IN which is counted as the first edge by the low frequency detector 3. At a time t8 a falling edge occurs in the input signal IN, then the input signal remains at level '0'. This is interpreted by the sampling means 4 as the absence of edges in the input signal at a time t9 and consequently the signal HLT is switched from '0' to '1'. However, since the count value CNT_3 is below the threshold value of seven, the control means 7 decide not to interrupt the counting of the reference clock counter 1 but to maintain signal RUN at '1'. For comparison: In FIG. 2, the count value CNT_3 of the low frequency detector 3 has already counted up to seven when the sampling means 4 detect the absence of edges in the input signal IN at time t2. Therefore, in that case the control means switch signal RUN from '1' to '0' thereby interrupting the counting of reference clock counter 1. The low frequency detector 3 is reset by the control means 7 via signal curve CLR_3 each time when the signal HLT is switched from '0' to '1'.

Taking into account that the input signal IN could also be a high frequency interfering signal HIS that has a frequency that is considerably higher than that of the carrier signal CS, it is advisable to adapt the input signal counter 2 as a non-overflow counter or as an overflow indicating counter. By checking that the count value CNT_2 has reached the maximum value, or that a flag that indicates a counter overflow has been set, the control means 7 are able to discriminate the high frequency interfering signal HIS from carrier signal CS.

In order to avoid dead-locks of the frequency measuring device 10, when a detected signal break exceeds a predetermined monitoring period (for instance, since the RFID transponder 20 has left the electromagnetic field) a watchdog timer 5 is provided which is adapted to initiate the means 9 for generating a measurement period to restart generating a new measurement period MP if no edge in the input signal IN has been detected for the monitoring period. The watchdog timer 5 is a counter that is triggered by the reference clock signal RC as a time basis and outputs a signal CLR_15 to the control means 7. The control means 7 reset the reference clock counter 1 via signal CLR_1 to restart counting from the initial value. The watchdog timer 5 is reset by the control means 7 via signal CLR_5 each time an edge is detected in the input signal IN by the sampling means 4.

It will be appreciated that although in the present example rising edges of the input signal IN have triggered the counting of the various counters of the frequency measuring device 10, of course falling edges or both rising and falling edges can be used for triggering the counting.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A device for measuring a frequency of an input signal that is expected to comprise a carrier signal either being unmodulated or being modulated according to a predefined signal coding, comprising:
    a reference clock counter for generating a measurement period which is adapted to count edges of a reference clock signal that has a constant reference frequency, wherein the measurement period is defined by the duration the reference clock counter needs to count from a predefined initial value to a predefined final value, wherein counting of the reference clock counter is temporarily halted when an absence of edges in the input signal is detected,
    an input signal counter being adapted to count edges of the input signal during the measurement period,
    sampling means for detecting whether the input signal contains edges,
    a controller being adapted to read a count value of the input signal counter on expiration of the measurement period and to derive the frequency of the input signal from the count value of the input signal counter, wherein the reference clock counter for generating the measurement period is adapted to extend the measurement period by a time period during which the absence of edges in the input signal is detected.

2. The device as claimed in claim 1, wherein the sampling means sample the input signal at a constant sample rate and detect the absence of edges in the input signal by detecting whether the level of the input signal remains within a predefined range of levels for a predefined number of sampling cycles.

3. The device as claimed in claim 1, wherein, when the re-occurrence of edges in the input signal is detected after the temporary absence of edges has occurred in the input signal, the reference clock counter resumes counting after a delay time that corresponds to the number of sampling cycles that has been necessary for the sampling means to detect the absence of edges in the input signal.

4. The device as claimed in claim 1, wherein the input signal counter is adapted as a non-overflow counter or as an overflow indicating counter.

5. The device as claimed in claim 1, comprising a low frequency signal detector which is adapted to prevent the reference clock counter for generating the measurement period from extending the measurement period prior to having counted a preset number of edges in the input signal, wherein the low frequency signal detector is cleared each time the absence of edges in the input signal has been detected.

6. The device as claimed in claim 1, comprising a watchdog timer which is adapted to initiate the reference clock counter for generating the measurement period to restart generating a new measurement period if no edge in the input signal has been detected for a predefined monitoring period.

7. The device as claimed in claim 6, wherein the monitoring period of the watchdog timer is reset each time an edge is detected in the input signal.

8. The device as claimed in claim 1, wherein deriving the frequency of the input signal from the count value of the input signal counter by the controller is accomplished by evaluating whether the count value of the input signal counter lies between predefined upper and lower limit values.

9. A method of measuring a frequency of an input signal that is expected to comprise a carrier signal either being unmodulated or being modulated according to a predefined signal coding, the method comprising:
  generating a measurement period by a reference clock counter that is adapted to count edges of a reference clock signal which has a constant reference frequency, wherein the measurement period is defined by a duration, which the reference clock counter needs to count from a predefined initial value to a predefined final value, wherein counting is temporarily halted when an absence of edges is detected in the input signal,
  counting edges in the input signal during the measurement period,
  detecting whether the input signal contains edges, on expiration of the measurement period, deriving the frequency of the input signal (IN) from the edge count value of the input signal,
  wherein the measurement period is extended by a time period during which an absence of edges in the input signal is detected.

10. The method as claimed in claim 9, wherein the input signal is sampled at a constant sample rate and the absence of edges in the input signal is detected by detecting whether the level of the input signal remains within a predefined range of levels for a predefined number of sampling cycles.

11. The method as claimed in claim 9, wherein, when the re-occurrence of edges in the input signal is detected after the temporary absence of edges in the input signal has occurred, the reference clock counter resumes counting after a delay time that corresponds to the number of sampling cycles that has been necessary to detect said absence of edges in the input signal.

12. The method as claimed in claim 9, wherein, when the count value of edges in the input signal reaches a predefined maximum value, counting is halted at this maximum count value, or a flag is set indicating that a counting overflow has occurred.

13. The method as claimed in claim 9, wherein even in case of absence of edges in the input signal the measurement period is not extended, unless prior to said detected absence of edges in the input signal a preset number of edges in the input signal has been counted.

14. The method as claimed in claim 9, wherein generating a new measurement period is started if no edges in the input signal (IN) have been detected for a predefined monitoring period.

15. The method as claimed in claim 9, wherein deriving the frequency of the input signal from the number of edges in the input signal that have been counted during the measurement period is accomplished by evaluating whether the number of counted edges lies between predefined upper and lower limit values.

* * * * *